United States Patent [19]
Bourdet et al.

[11] Patent Number: 5,497,075
[45] Date of Patent: Mar. 5, 1996

[54] APPARATUS FOR MEASURING PULSE ENERGY

[75] Inventors: Yves Bourdet, Saint Cloud; Christian Girard, Montmagny, both of France

[73] Assignee: Alcatel Cable, Clichy Cedex, France

[21] Appl. No.: 352,727

[22] Filed: Dec. 2, 1994

[30] Foreign Application Priority Data

Dec. 3, 1993 [FR] France .................................. 93 14539

[51] Int. Cl.$^6$ ................................................ G01R 31/02
[52] U.S. Cl. ........................ 324/72; 324/127; 324/509; 324/543; 340/664
[58] Field of Search ........................... 324/72, 509, 510, 324/511, 543, 544, 110, 115, 117 R, 127; 340/664; 361/57, 87

[56] References Cited

U.S. PATENT DOCUMENTS

| | | | |
|---|---|---|---|
| 3,889,185 | 6/1975 | Wojtasinski et al. | 324/72 |
| 4,234,900 | 11/1980 | Miyazaki et al. | 324/509 X |
| 4,513,339 | 4/1985 | Ishigami et al. | 361/87 X |
| 4,528,497 | 7/1985 | Arato | 324/509 |
| 4,577,148 | 3/1986 | Sweetana | 324/72 |
| 5,008,631 | 4/1991 | Scherer et al. | 330/51 |
| 5,270,637 | 12/1993 | McEachern et al. | 324/127 X |

FOREIGN PATENT DOCUMENTS

| | | |
|---|---|---|
| 0549432 | 6/1993 | European Pat. Off. . |
| 2374783 | 7/1978 | France . |
| 1272074 | 10/1989 | Japan . |
| 5111147 | 4/1993 | Japan . |

OTHER PUBLICATIONS

Mulder et al, "A Microprocessor Based Monitoring and Protective System for a Series Capacitor ZnO Nonlinear Resistor", Sep. 1980, IEEE vol. 99, No. 5, pp. 1879–1885.

*Primary Examiner*—Kenneth A. Wieder
*Assistant Examiner*—Diep Do
*Attorney, Agent, or Firm*—Sughrue, Mion, Zinn, Macpeak & Seas

[57] ABSTRACT

The apparatus for measuring pulse energy includes integration means and serves to measure high-current disturbances carried by a cable. The apparatus is characterized in that it further includes a current-to-voltage converter (2) mounted on the cable (1), attenuation means (3, 4) coupling said converter to the integration means (5, 6), and a processing and storage assembly (12) coupled to the integration means and to an output display (20). Application: monitoring lightning protection equipment.

5 Claims, 1 Drawing Sheet

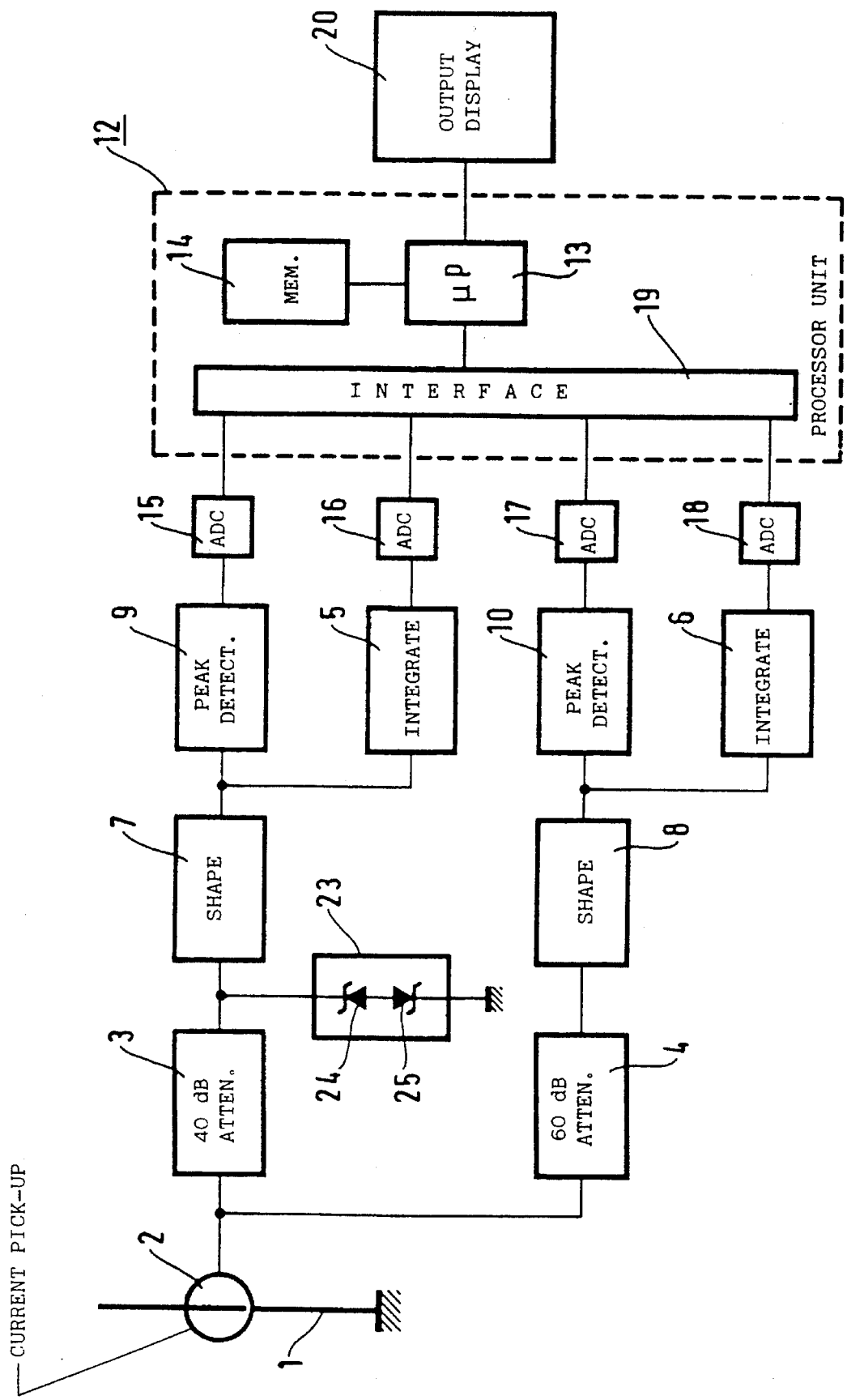

5,497,075

APPARATUS FOR MEASURING PULSE ENERGY

BACKGROUND OF THE INVENTION

The present invention relates to apparatus for measuring pulse energy, the apparatus including integration means and serving to measure high-current disturbances carried by a cable. The present invention applies in particular to measuring energy from disturbances carried by a grounding cable via protection equipment, and as caused by lightning or of electromagnetic origin, especially with a view to monitoring such equipment.

Various types of protection equipment for providing protection against disturbances caused by lightning or of electromagnetic origin are known per se, e.g. lightning arresters or circuits or apparatus for protecting power lines, installations, or appliances. Such equipment is provided with a grounding cable for carrying the current due to each disturbance to ground. Such disturbances are of relatively low frequency, and not more than about 1 MHz to 2 MHz. The current due to such disturbances is high, its maximum value may vary from one disturbance to another, and said maximum value may be about one hundred kiloamperes.

To make the protection provided by such equipment reliable, it is useful to have information giving the stresses on each item of protection equipment, so as to make it possible to determine the effectiveness of the equipment or to estimate its operating state at any given time and its probable life span, and to perform the appropriate maintenance operations.

To that end, lightning pulse counters are known that count the disturbances received and that increment a display by unity each time a new disturbance is received. Unfortunately, such counting is only a very inaccurate reflection of the real stresses on the protection equipment in question.

SUMMARY OF THE INVENTION

An object of the present invention is to remedy that problem by measuring energy from the received disturbances, in particular so as to determine accurately and at any time the real stresses on an item of protection equipment for providing protection against such disturbances.

The present invention provides apparatus for measuring pulse energy, the apparatus being designed to measure the energy from high-current disturbances carried by a cable, said apparatus including:

a current-to-voltage converter delivering a voltage that is proportional to the current in said cable;

an analog measurement branch connected to said current-to-voltage converter; and a processing and storage assembly coupled to said measurement branch and to an output display;

said apparatus being characterized in that it includes at least two measurement branches, each of which includes an input attenuator and an output integrator coupled to said input attenuator, the attenuators in said branches being of different attenuations and being connected in parallel to said current-to-voltage converter.

The apparatus advantageously further includes at least one of the following additional characteristics:

the current-to-voltage conversion ratio of said converter is less than 1, and said converter is in particular a current pick-up mounted around said cable and having a conversion ratio of about $1/10$;

said processing and storage assembly is a logic assembly having a microprocessor and an associated memory;

the apparatus further includes a peak-limiting circuit associated with each attenuator, optionally with the exception of the attenuator that has the highest attenuation, the peak-limiting circuit limiting the output voltage of the attenuator in question so as to protect both the integrator of each branch and also the processing and storage assembly; and in each measurement branch, the apparatus further includes peak value detection means connected in parallel with the integrator of the branch to the input attenuator of the branch, and coupled to said processing and storage assembly.

BRIEF DESCRIPTION OF THE DRAWING

The characteristics and advantages of the present invention will appear on reading the following description of an embodiment given with reference to the sole FIGURE of the accompanying drawing, in which:

the sole FIGURE is a block diagram representing apparatus of the invention for measuring pulse energy.

DESCRIPTION OF A PREFERRED EMBODIMENT

The FIGURE shows a cable, referenced 1, carrying transient disturbances, the energy of which is to be measured, the current of such disturbances being high and varying from one disturbance to another. The cable 1 is in particular the grounding cable for protection equipment, e.g. for protecting a power line against disturbances caused by lightning or of electromagnetic origin, which equipment is known per se and is not shown. The grounding cable grounds the successive received disturbances that trigger the protection equipment. The current due to such disturbances and flowing through the cable lies in the range 1 kA to 100 kA.

The measurement apparatus shown includes a current pick-up 2 which is mounted around the cable 1, which is responsive to current flowing through the cable, and which delivers a voltage that is substantially proportional to said current. The pick-up is advantageously chosen so as to have a current-to-voltage conversion ratio of less than 1. In particular, the pick-up may be a "Pearson" pick-up having (current transformer) a conversion (transformation) ratio of $1/10$. Under these conditions, the output voltage of the pick-up lies in the range 100 V to 10 kV, for current flowing through the cable lying in the range 1 kA to 100 kA.

The measurement apparatus further includes two attenuators 3 and 4 of different attenuations, both attenuators being connected to the output of the pick-up 2, and two integrators 5 and 6, one of which is connected to attenuator 3 via a shaping circuit 7, and the other integrator is connected to attenuator 4 via another shaping circuit 8. Advantageously, the apparatus also includes two peak detectors 9 and 10, each of which is also connected to the output of a respective one of the shaping circuits 7 and 8.

The outputs of the two integrators 5 and 6 and of the peak detectors 9 and 10 are connected to a processing and management logic assembly 12. The logic assembly 12 is organized essentially around a microprocessor 13 and an associated memory 14. It further includes four analog-to-digital conversion input circuits 15 to 18 which are connected to the integrators and to the peak detectors, and an interface circuit 19 between the input circuits and the microprocessor. The logic assembly is connected to an output display 20 via an output interface circuit (not shown) belonging either to the display or to the logic assembly 12.

The attenuators 3 and 4 divide into two the range of possible values for the output voltage of the pick-up 2, to enable greater accuracy to be obtained when measuring energy from each disturbance grounded by the cable 1.

In this embodiment, attenuator 3 provides attenuation of 40 dB. It is followed by a peak-limiting circuit 23 which limits the level of the output signal of the attenuator to a value compatible with the downstream circuits that receive said output signal. The peak-limiting circuit is implemented by two Zener diodes 24 and 25 having 13.5 V maximum cut-off threshold voltage and mounted head-to-tail between the output of attenuator 3 and ground. The peak-limiting circuit makes it possible to feed the integrators, the peak detectors, and the logic assembly at a voltage of ±15 V, and to provide good protection for the circuits.

Attenuator 4 provides attenuation of 60 dB. It needs no associated peak-limiting circuit because the maximum level of its output signal lies in the range 0.1 V to 10 V.

The two attenuators connected in common to the pick-up 2 define two measurement branches from the pick-up as a function of the current resulting from each incident disturbance carried by the cable 1. The two measurement branches correspond respectively to currents lying in the range 1 kA to about ten kA in cable 1, for which currents the output voltage of attenuator 3 after peak-limiting lies in the range 1 V to 13.5 V maximum, and to currents lying in the range 10 kA to 100 kA in cable 1, for which currents the output voltage of attenuator 4 lies in the range 1 V to 10 V.

The measurements taken by the two integrators overlap each other for currents flowing through the cable 1 of 10 kA and slightly more. The two integrators simultaneously receive input signals which present a ratio to each other of 10, but which never exceed 15 V. In practice, only one of the two integrators is chosen for measuring the energy from each incident disturbance, as a function of the current flowing through the cable, by comparing pairs of signals received from each measurement branch by the logic assembly.

The shaping circuits filter and smooth the signals delivered by the attenuators.

In the logic assembly 12, the microprocessor 13 sequentially reads the outputs of the analog-to-digital conversion circuits 15 to 18. It associates together in pairs the two digital measurement signals coming from each branch. It selects that one of the pairs which is more representative of the incident disturbance, so as to store the selected pair and the date on which the disturbance occurred, and so as to display them.

The display makes it possible, on request, to see all of the disturbances stored in this way as they have occurred over time, or during some desired period.

The logic assembly may also count the disturbances as they occur, so as to display the number of disturbances that have occurred.

The apparatus is described with reference to the embodiment shown. Naturally, the numerical values indicated in the above description are given merely by way of example to facilitate understanding. Also naturally, the apparatus may include a single measurement branch, or more than two measurement branches, depending on the desired accuracy of the energy measurement.

We claim:

1. An apparatus for measuring pulse energy, the apparatus being designed to measure the energy from high-current disturbances carried by a cable, said apparatus including:

a current-to-voltage converter delivering at an output end thereof a voltage that is proportional to the current in said cable;

an analog measurement circuit connected at an input end thereof to the output end of said current-to-voltage converter; and a processing and storage assembly having an input end, coupled to an output end of said measurement circuit, and an output end coupled to an output display;

said apparatus being characterized in that said analog measurement circuit comprises at least two measurement branches, each of which includes an input attenuator (3, 4) and an output integrator (5, 6) having an input end coupled to an output end of said input attenuator, the attenuators in said branches being of different attenuations and having respective input ends connected in parallel to said current-to-voltage converter (2).

2. Apparatus according to claim 1, characterized in that the current-to-voltage conversion ratio of said converter (2) is less than 1.

3. Apparatus according to claim 2, characterized in that said converter (2) is a current pick-up mounted around said cable (1) and having a conversion ratio of about 1/10.

4. The apparatus according to claim 1, characterized in that it further includes a peak-limiting circuit (23) coupled to the output end of each attenuator (3, 4), with the exception of the attenuator that has the highest attenuation, the peak-limiting circuit limiting the output voltage of the attenuator in question so as to protect both the integrator and also the processing and storage assembly.

5. The apparatus according to claim 1, characterized in that each measurement branch further includes a peak value detector (9, 10) having an input end which is connected in parallel with the input end of said integrator (5, 6) of the measurement branch and which is coupled to the output end of the input attenuator (3, 4) of the measurement branch, and having an output end coupled to the input end said processing and storage assembly (12).

* * * * *